US010063242B2

United States Patent
Wu et al.

(10) Patent No.: US 10,063,242 B2
(45) Date of Patent: Aug. 28, 2018

(54) PHASE-LOCKED LOOP METHOD FOR USE IN UTILITY ELECTRICITY PARALLEL-CONNECTION SYSTEM

(71) Applicant: NATIONAL CHUNG SHAN INSTITUTE OF SCIENCE AND TECHNOLOGY, Taoyuan (TW)

(72) Inventors: Chi-Sheng Wu, Taoyuan (TW); Kuo-Kuang Jen, Taoyuan (TW); Hsuang-Chang Chiang, Taoyuan (TW); Tsang-Li Tai, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

(21) Appl. No.: 15/372,662

(22) Filed: Dec. 8, 2016

(65) Prior Publication Data
US 2018/0167074 A1    Jun. 14, 2018

(51) Int. Cl.
*H03L 7/06* (2006.01)
*H03L 7/085* (2006.01)
*H02J 3/40* (2006.01)

(52) U.S. Cl.
CPC ............... *H03L 7/085* (2013.01); *H02J 3/40* (2013.01)

(58) Field of Classification Search
CPC ...................................................... H03L 7/085
See application file for complete search history.

(56) References Cited

U.S. PATENT DOCUMENTS

2004/0264089 A1*  12/2004  Furuya ............... H02J 3/38
361/92

* cited by examiner

*Primary Examiner* — Daniel Puentes
(74) *Attorney, Agent, or Firm* — Schmeiser, Olsen & Watts, LLP (57) ABSTRACT

A phase-locked loop method for use in utility electricity parallel-connection system is introduced. The phase-locked loop method comprises a conversion signal generating step, an error calculating step, a frequency correction signal obtaining step, an angle signal obtaining step, and a synchronous signal generating step to not only calculate an error value by detecting a utility electricity voltage, but also reduce or return-to-zero the error value by proportional integral adjustment. With the steps, the phase-locked loop method achieves synchrony precisely by eliminating input utility electricity voltage distortion and frequency variation. Furthermore, the phase-locked loop method advantageously features quick response and a wide frequency range and therefore is effective in tracking power generation facilities, such as a diesel generator, and expanding inverters.

9 Claims, 10 Drawing Sheets

PHASE-LOCKED LOOP METHOD FOR USE IN UTILITY ELECTRICITY PARALLEL-CONNECTION SYSTEM

FIELD OF THE INVENTION

The present invention relates to phase-locked loop methods and, more particularly, to a phase-locked loop method for use in utility electricity parallel-connection system.

BACKGROUND OF THE INVENTION

A conventional utility electricity parallel-connection system usually has an inverter circuit that can be controlled in a digital manner. The inverter circuit detects a utility electricity voltage to generate sinusoidal synchronous signals. The sinusoidal synchronous signals are sent to a current loop or AC voltage control loop in the inverter circuit so that the voltage, frequency and phase of the inverter circuit equal to the voltage, frequency and phase of the utility electricity, thereby achieving power flow control between the inverter circuit and the utility electricity.

Figure 1:
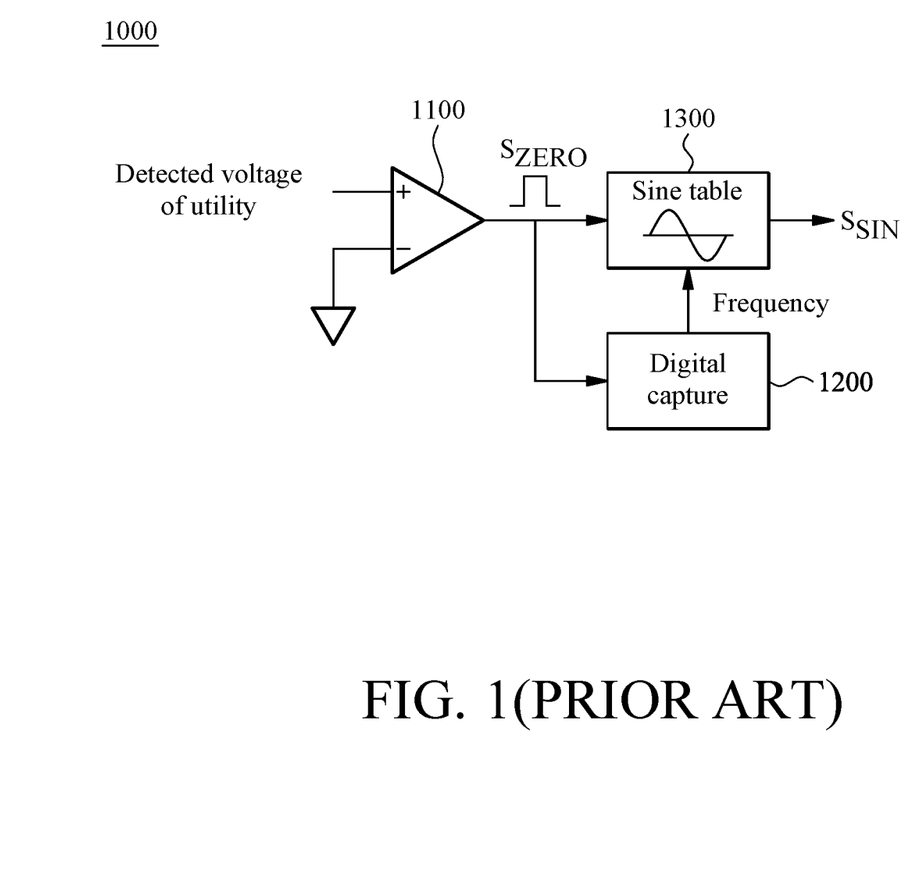
FIG. 1 (PRIOR ART) is a schematic view of a conventional inverter circuit.

A conventional inverter circuit 1000, as shown in FIG. 1, comprises a comparator or operational amplifier 1100 for detecting the zero-crossing point of utility electricity voltage $V_S$. The zero-crossing signal $S_{ZERO}$ not only calculates its frequency by digital capture 1200 but also uses the zero-crossing signal $S_{ZERO}$ to reset a predetermined sine table 1300 and generate synchronous sinusoidal wave signal $S_{SIN}$ required for the inverter circuit 1000.

However, when the inverter circuit 1000 is operating, the reset signal is predisposed to oscillation, because of utility electricity voltage distortion and oscillation of the zero-crossing signal of the detection circuit, thereby causing sine table oscillation. In an attempt to solve the aforesaid problems, waveforms of the detected utility electricity voltage are improved with a low-pass filter, and signal oscillation is alleviated by a comparator with magnetic hysteresis; however, the techniques lead to phase delay of a sine table and therefore are inapplicable whenever voltage frequency variations are large.

SUMMARY OF THE INVENTION

It is an objective of the present invention to provide a phase-locked loop method which eliminate input utility electricity voltage distortion and frequency variation and thereby achieve synchrony precisely, allowing an inverter to be insusceptible to utility electricity perturbation and thereby function well.

Another objective of the present invention is to provide a phase-locked loop method that advantageously features quick response and a wide frequency range and therefore is effective in tracking power generation facilities, such as a diesel generator, and expanding inverters.

In order to achieve the above and other objectives, the present invention provides a phase-locked loop method for use in a utility electricity parallel-connection system. The phase-locked loop method comprises a conversion signal generating step, an error calculating step, a frequency correction signal obtaining step, an angle signal obtaining step, and a synchronous signal generating step.

The conversion signal generating step involves generating a first conversion signal and a second conversion signal by detecting a voltage of a utility electricity, the first conversion signal being a first function, and the second conversion signal being a second function. The error calculating step involves calculating an error value according to values of the first conversion signal, the second conversion signal, a first synchronous signal, and a second synchronous signal, respectively, the first synchronous signal being the second function, and the second synchronous signal being the first function. The frequency correction signal obtaining step involves entering an error signal with the error value into a proportional integrator to obtain a frequency correction signal. The angle signal obtaining step involves adding the frequency correction signal and the original frequency to obtain an adjustment frequency and then calculating an integral of the adjustment frequency to obtain an angle signal. The synchronous signal generating step involves looking up a first function table and a second function table to obtain a value related to the angle value of the angle signal, wherein the value related to the angle value of the angle signal and attributed to the first function table is used as a value of the first synchronous signal, and the value related to the angle value of the angle signal and attributed to the second function table is used as a value of the second synchronous signal.

In an embodiment of the phase-locked loop method of the present invention, the first function table is a sine table, and the second function table is a cosine table, with a 90 degree phase difference between the first synchronous signal and the second synchronous signal.

In an embodiment of the phase-locked loop method of the present invention, the error calculating step comprises a first product obtaining step, a second product obtaining step, and an error value obtaining step. The first product obtaining step involves multiplying the value of the first conversion signal by the value of the first synchronous signal to obtain a first product. The second product obtaining step involves multiplying the value of the second conversion signal by the value of the second synchronous signal to obtain a second product. The error value obtaining step involves subtracting the second product from the first product to obtain the error value.

In an embodiment of the phase-locked loop method of the present invention, an angle limiting step occurs between the angle signal obtaining step and the synchronous signal generating step and involves limiting the angle value of the angle signal to a range by a range limiter.

In an embodiment of the phase-locked loop method of the present invention, the utility electricity has three-phase voltages which are detected in the conversion signal generating step to generate the first conversion signal and the second conversion signal.

In an embodiment of the phase-locked loop method of the present invention, the utility electricity has a single-phase voltage which is detected in the conversion signal generating step to generate the first conversion signal and the second conversion signal.

In an embodiment of the phase-locked loop method of the present invention, the conversion signal generating step further comprises a sampling step for sampling the detected utility electricity voltages to generate the first conversion signal.

In an embodiment of the phase-locked loop method of the present invention, the conversion signal generating step further comprises a delaying step for delaying the first conversion signal to generate the second conversion signal.

With the aforesaid steps, the phase-locked loop method achieves synchrony precisely by eliminating input utility electricity voltage distortion and frequency variation. Furthermore, the phase-locked loop method advantageously features quick response and a wide frequency range and therefore is effective in tracking power generation facilities, such as a diesel generator, and expanding inverters.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION OF THE PREFERRED EMBODIMENTS

Figure 2:
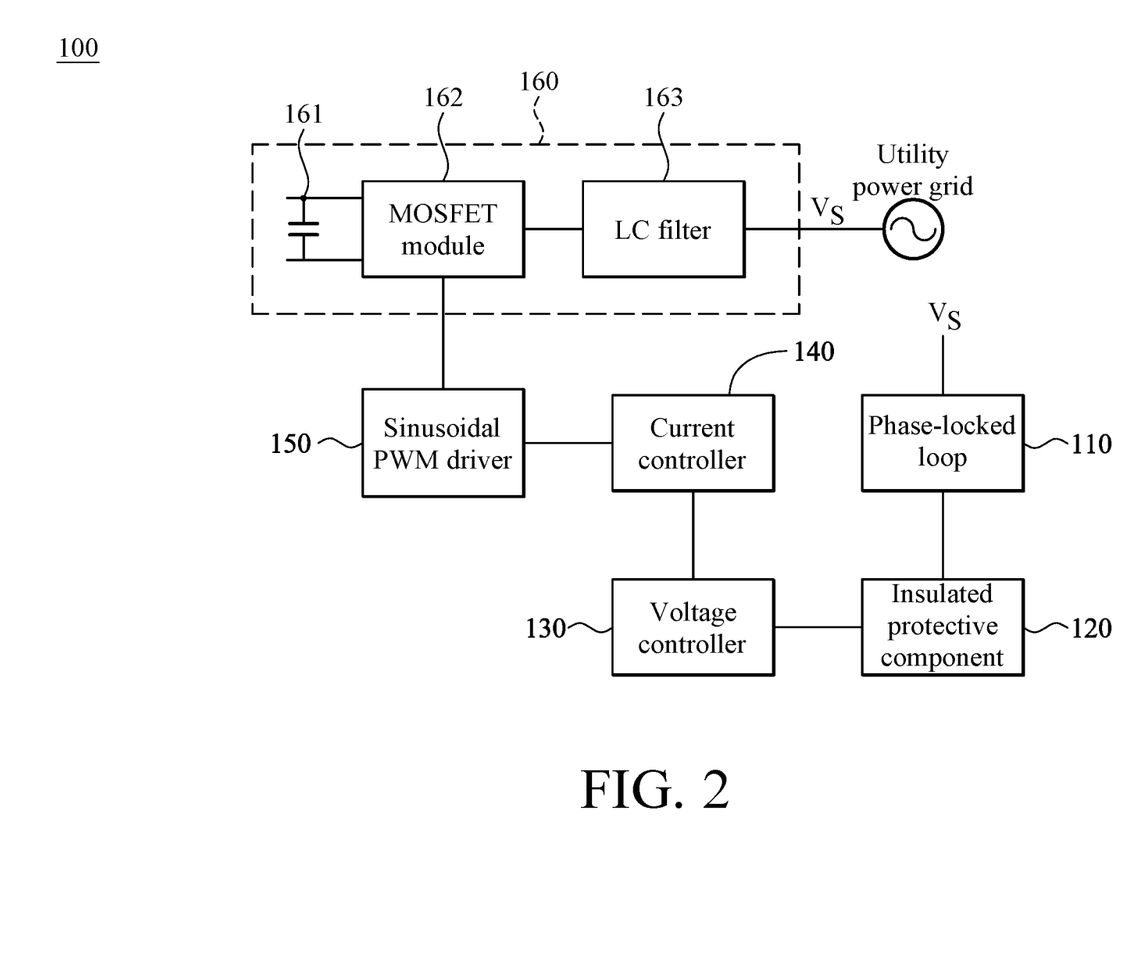
FIG. 2 is a system block diagram of a utility electricity parallel-connection system for use with a phase-locked loop method according to an embodiment of the present invention.

Referring to FIG. 2, it is a system block diagram of a utility electricity parallel-connection system 100 for use with a phase-locked loop method according to an embodiment of the present invention. As shown in FIG. 2, the utility electricity parallel-connection system 100 comprises a phase-locked loop 110, an insulated protective component 120, a voltage controller 130, a current controller 140, a sinusoidal PWM driver 150, and an inverter 160. The inverter 160 comprises a DC bus 161, a MOSFET module 162, and an LC filter 163. The LC filter 163 is connected to a utility power grid.

The phase-locked loop 110 detects a utility electricity voltage, reduces gradually the errors, such as phase difference, of the output signals (for example, sinusoidal wave signal) and utility electricity voltage by a built-in tracking adjustment mechanism, and therefore makes the voltage, frequency, and phase of the inverter 160 equal to the voltage, frequency, and phase of the utility electricity, thereby achieving power flow control between the inverter 160 and the utility electricity.

The utility electricity parallel-connection system 100 of FIG. 2 serves an exemplary purpose and therefore is not restrictive of the phase-locked loop method of the present invention. The phase-locked loop method of the present invention is applicable to various utility electricity parallel-connection systems and at least comprises a grid-tied renewable power generation system and an uninterruptable power supply (UPS).

Figure 3:
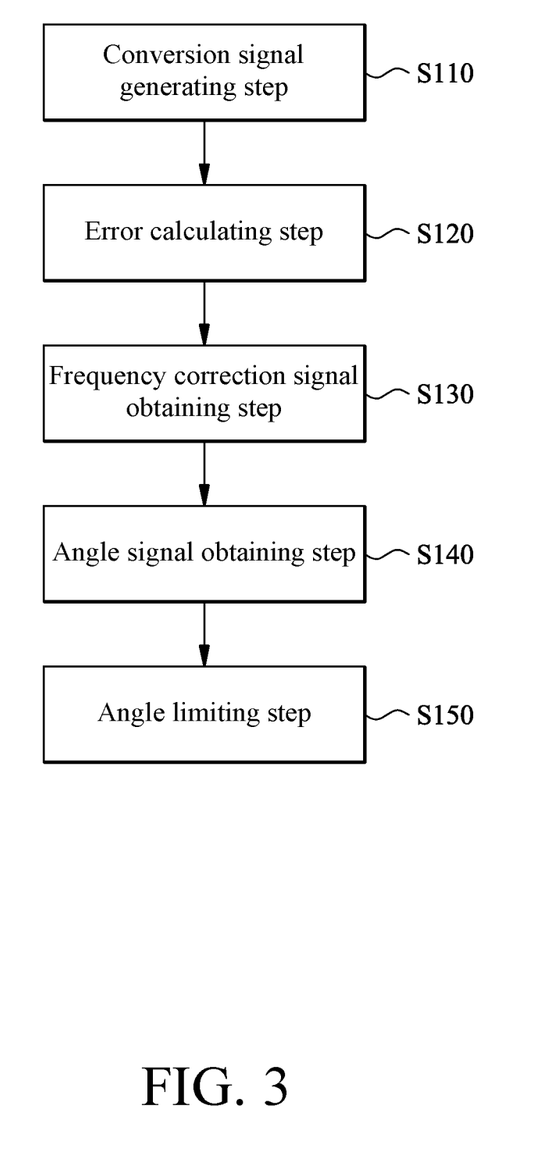
FIG. 3 is a flowchart of the phase-locked loop method according to an embodiment of the present invention.

Referring to FIG. 3, it is a flowchart of the phase-locked loop method according to an embodiment of the present invention. As shown in FIG. 3, the phase-locked loop method comprises a conversion signal generating step S110, an error calculating step S120, a frequency correction signal obtaining step S130, an angle signal obtaining step S140, and a synchronous signal generating step S150.

The conversion signal generating step S110 involves generating a first conversion signal S1 and a second conversion signal S2 by detecting a utility electricity voltage. In an embodiment, the value of the first conversion signal S1 is denoted by $V_m \sin(\omega t)$, and the first conversion signal S1 is a sine function, therefore the sine function is also known as the first function. The first conversion signal S1 is a first function. The value of the second conversion signal S2 is denoted by $V_m \cos(\omega t)$, and the second conversion signal S2 is a cosine function, therefore the cosine function is also known as the second function. The second conversion signal S2 is a second function. Furthermore, $V_m$ denotes the root mean square voltage of the utility electricity, $\omega$ denotes the original frequency, and t denotes time.

Although, in the embodiment, the first function and second function are sine function and cosine function, respectively, the present invention is not limited thereto. For example, in a variant embodiment, the first function is a cosine function, and the second function is a sine function.

The error calculating step S120 involves calculating an error value e according to the values of the first conversion signal S1, the second conversion signal S2, a first synchronous signal S3, and a second synchronous signal S4, respectively. In an embodiment, the value of the first synchronous signal S3 is denoted by $\cos(\omega_1 t)$, the first synchronous signal S3 is a cosine function, and therefore the first synchronous signal S3 is a second function. The value of the second synchronous signal S4 is denoted by $\sin(\omega_1 t)$, the second synchronous signal S4 is a sine function, and therefore the second synchronous signal S4 is a first function. Furthermore, $\omega_1$ denotes the adjusted frequency upon completion of frequency correction.

For example, the error value e is calculated by the equation below.

$$e = V_m \{\sin(\omega t)\cos(\omega_1 t) - \cos(\omega t)\sin(\omega_1 t)\}$$

wherein $V_m \sin(\omega t)\cos(\omega_1 t)$ is known as a first product. The first product equals the product of the value of the first conversion signal S1 and the value of the first synchronous signal S3. $V_m \cos(\omega t)\sin(\omega_1 t)$ is known as a second product. The second product equals the product of the value of the second conversion signal S2 and the value of the second synchronous signal S4. The error value e is obtained by subtracting the second product from the first product.

The frequency correction signal obtaining step 130 involves entering an error signal with the error value e into a proportional integrator to obtain a frequency correction signal S5, wherein the value of the frequency correction signal S5 is denoted by $\Delta\omega$.

The angle signal obtaining step 140 involves adding the frequency correction signal $\Delta\omega$ and the original frequency $\omega_0$ to obtain the adjustment frequency $\omega_1$ and then calculating the integral of the adjustment frequency $\omega_1$ to obtain an angle signal $\theta$, that is, $\omega_1 = \omega_0 + \Delta\omega$, thereby calculating the integral of $\omega_1$ to obtain $\theta$.

The synchronous signal generating step 150 involves looking up a first function table T1 and a second function table T2 to obtain the value related to the angle value of the angle signal θ. In the embodiment, the first function table T1 is a cosine table, whereas the second function table T2 is a sine table, wherein there is a 90 degree phase difference between the first synchronous signal S3 and the second synchronous signal S4. Therefore, if θ=60°, then look up the first function table T1 to obtain cos(60°)=½ and look up the second function table T2 to obtain $$\sin(60°) = \frac{\sqrt{3}}{2}.$$

Figure 4:
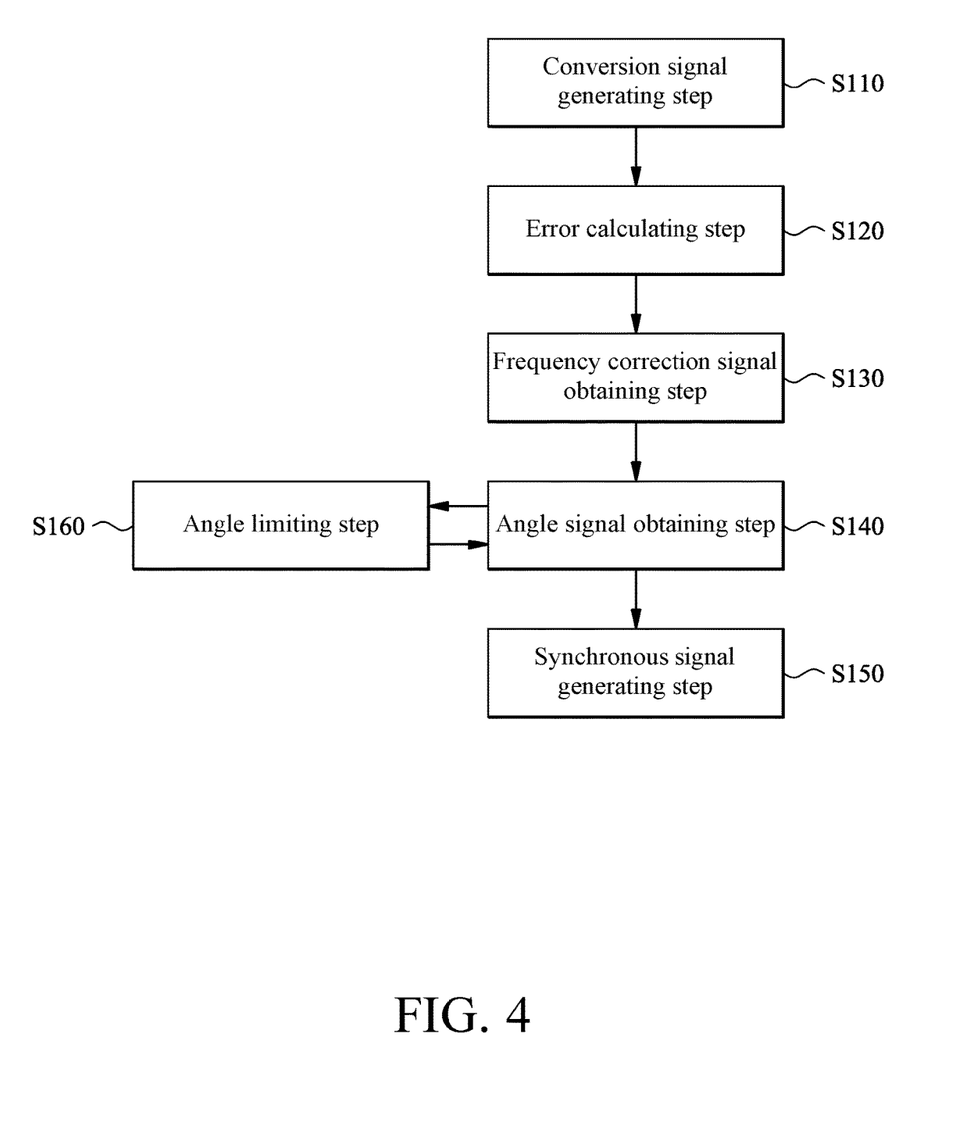
FIG. 4 is a flowchart of the phase-locked loop method according to another embodiment of the present invention.

Referring to FIG. 4, an angle limiting step S160 occurs between the angle signal obtaining step 140 and the synchronous signal generating step 150. The angle limiting step S160 involves limiting the angle value of the angle signal θ to a range, such as 0~2π, by a range limiter. The purpose of the angle limiting step S160 is to ensure that, when converted, the angle value of the angle signal θ will fall within a predetermined range for certain, and place the dimensions of the first function table T1 and the second function table T2 under appropriate control, for example, without giving considerations to the related values of the first function table T1 and the second function table T2 when θ=2~4π. It is because θ falls within the range of 0~2π for certain after conversion, and the value of sin θ equals to the value of cos θ for certain after conversion.

The angle value of the angle signal θ has a related value in the first function table T1, and the related value is used as the value of the first synchronous signal S3; hence, the value of the first synchronous signal S3 is denoted by $\cos(\omega_1 t)$. The angle value of the angle signal θ has a related value in the second function table T2, and the related value is used as the value of the second synchronous signal S4; hence, the value of the second synchronous signal S4 is denoted by $\sin(\omega_1 t)$. For example, if θ=60°, then the value of the first synchronous signal S3 equals ½, and the value of the first synchronous signal S4 equals $$\frac{\sqrt{3}}{2}.$$

With the aforesaid steps, the error value e is gradually reduced to zero by proportional integral adjustment, so as to achieve phase locking; hence, ωhd 1=ω, Δω=0. In case of utility electricity voltage signal distortion or frequency oscillation, the error arising from utility electricity voltage signal distortion or frequency oscillation can be reduced by feedback control of the phase-locked control loop, thereby precluding phase-locked signal oscillation.

Unlike the prior art which discloses joint operation of a detection circuit and a comparator or an operational amplifier, the present invention provides a phase-locked loop method for directly converting a utility electricity voltage into a conversion signal in the form of a first function or a second function to not only increase response speed but also expand an applicable frequency range, thereby being applicable to tracking power generation facilities, such as a diesel generator.

Figure 5:
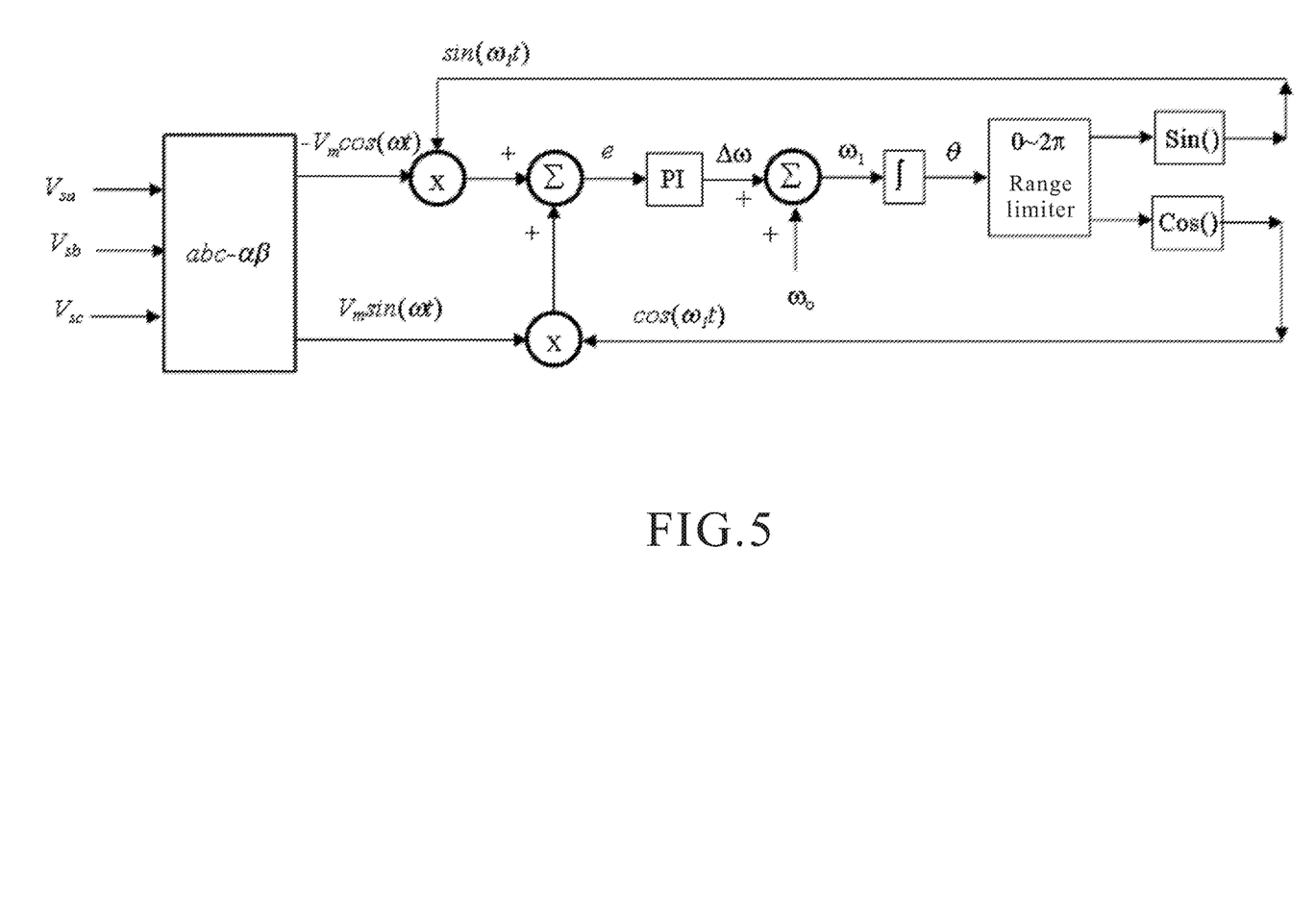
FIG. 5 is a schematic view when the utility electricity has three-phase voltages according to an embodiment of the present invention.
Figure 6:
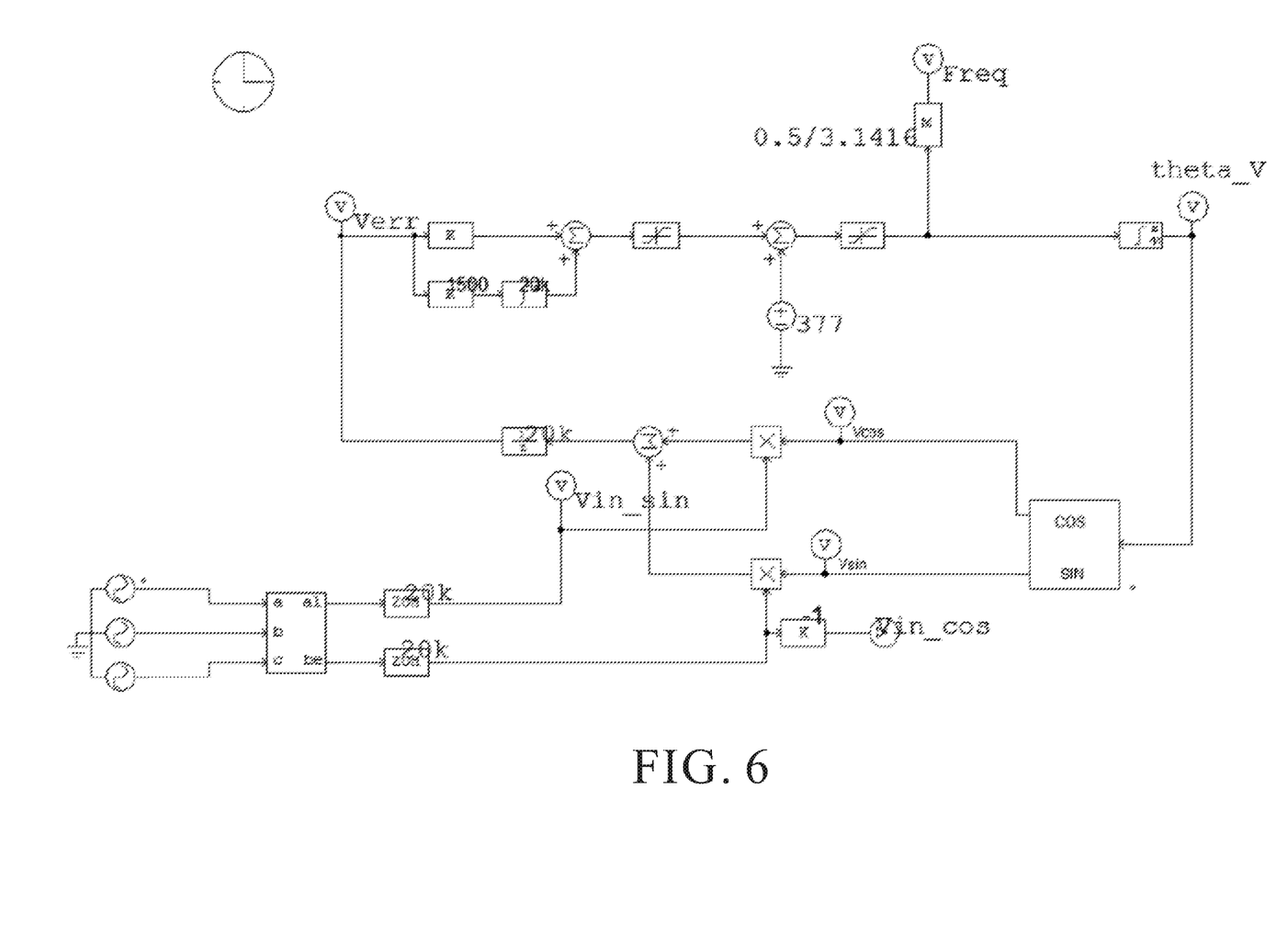
FIG. 6 is a simulated circuit diagram when the utility electricity has three-phase voltages according to an embodiment of the present invention.
Figure 7:
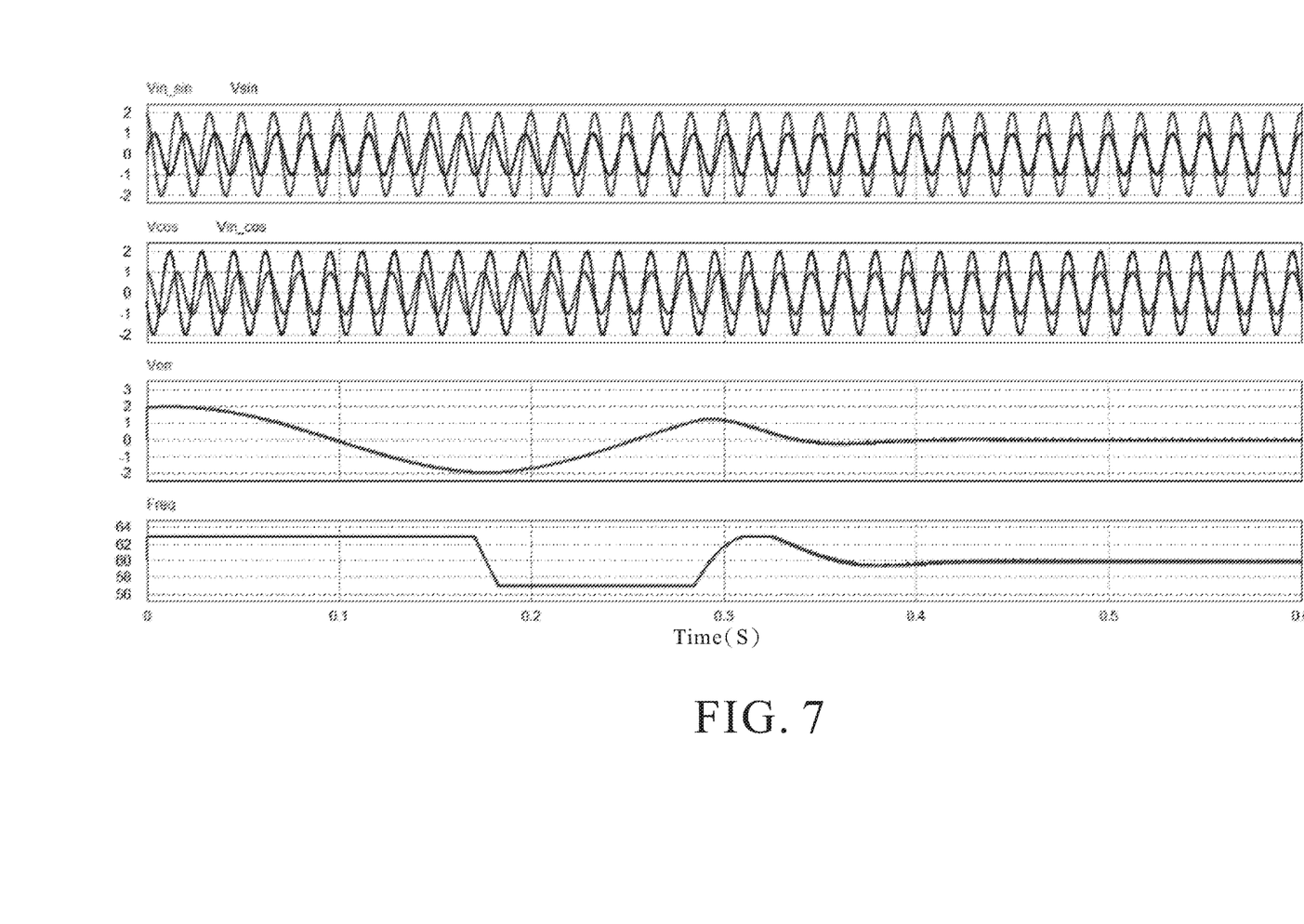
FIG. 7 is a schematic view of the results of simulation when the utility electricity has three-phase voltages according to an embodiment of the present invention.
Figure 8:
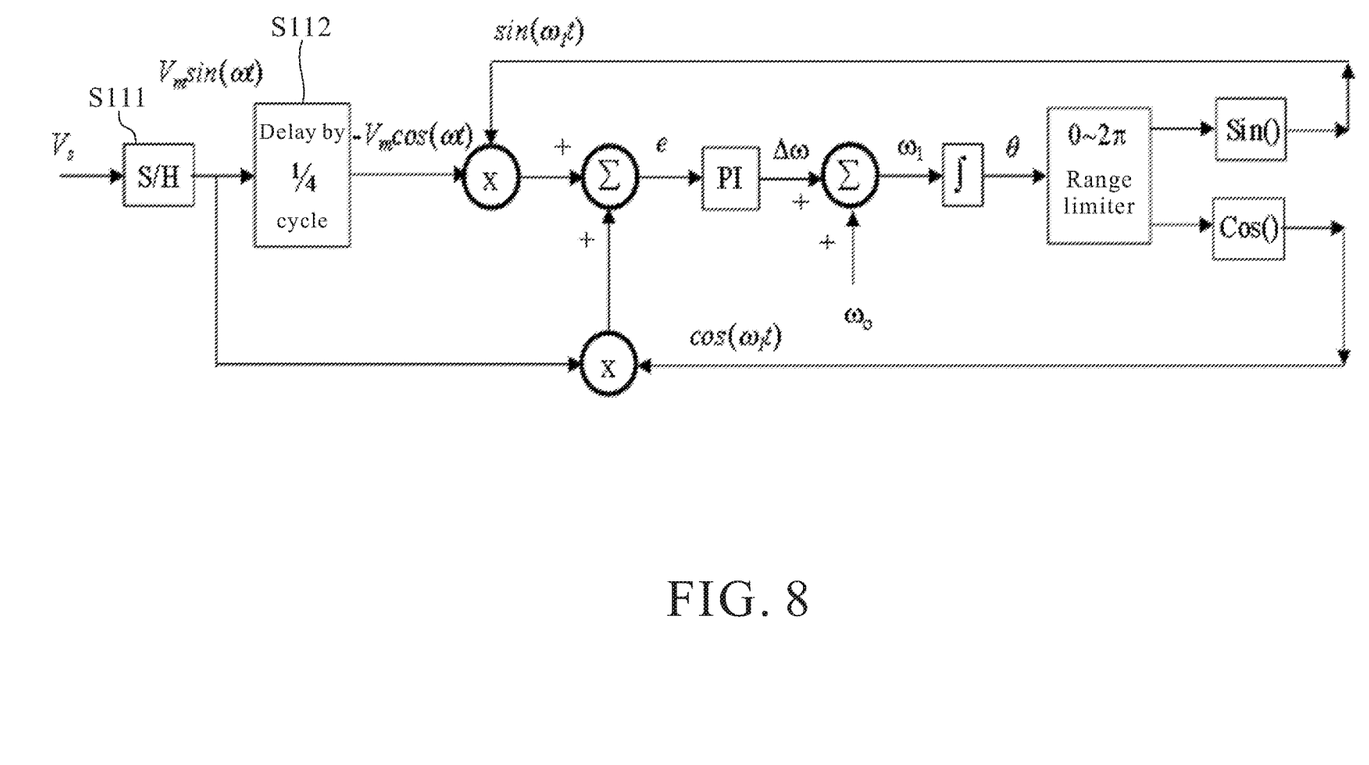
FIG. 8 is a schematic view when the utility electricity has a single-phase voltage according to an embodiment of the present invention.
Figure 9:
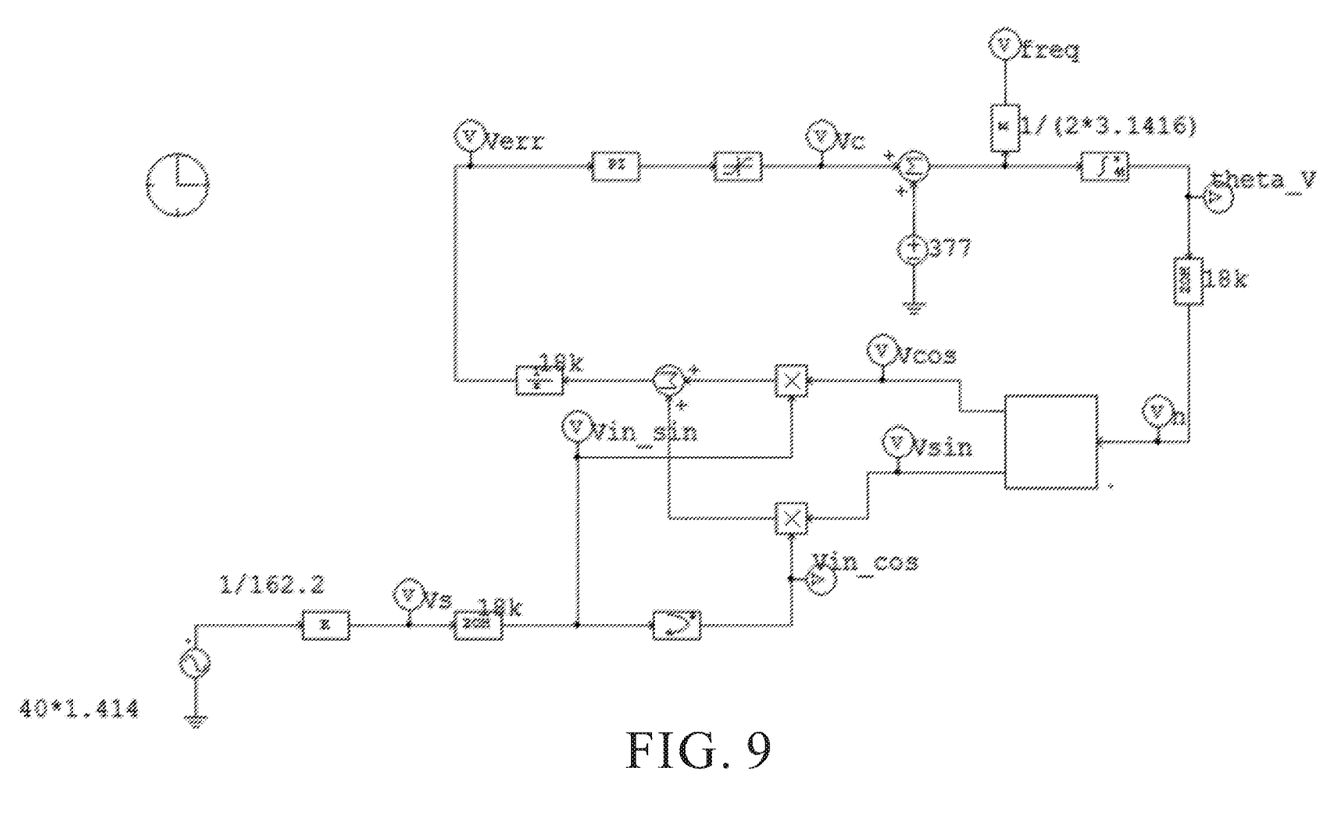
FIG. 9 is a simulated circuit diagram when the utility electricity has a single-phase voltage according to an embodiment of the present invention.
Figure 10:
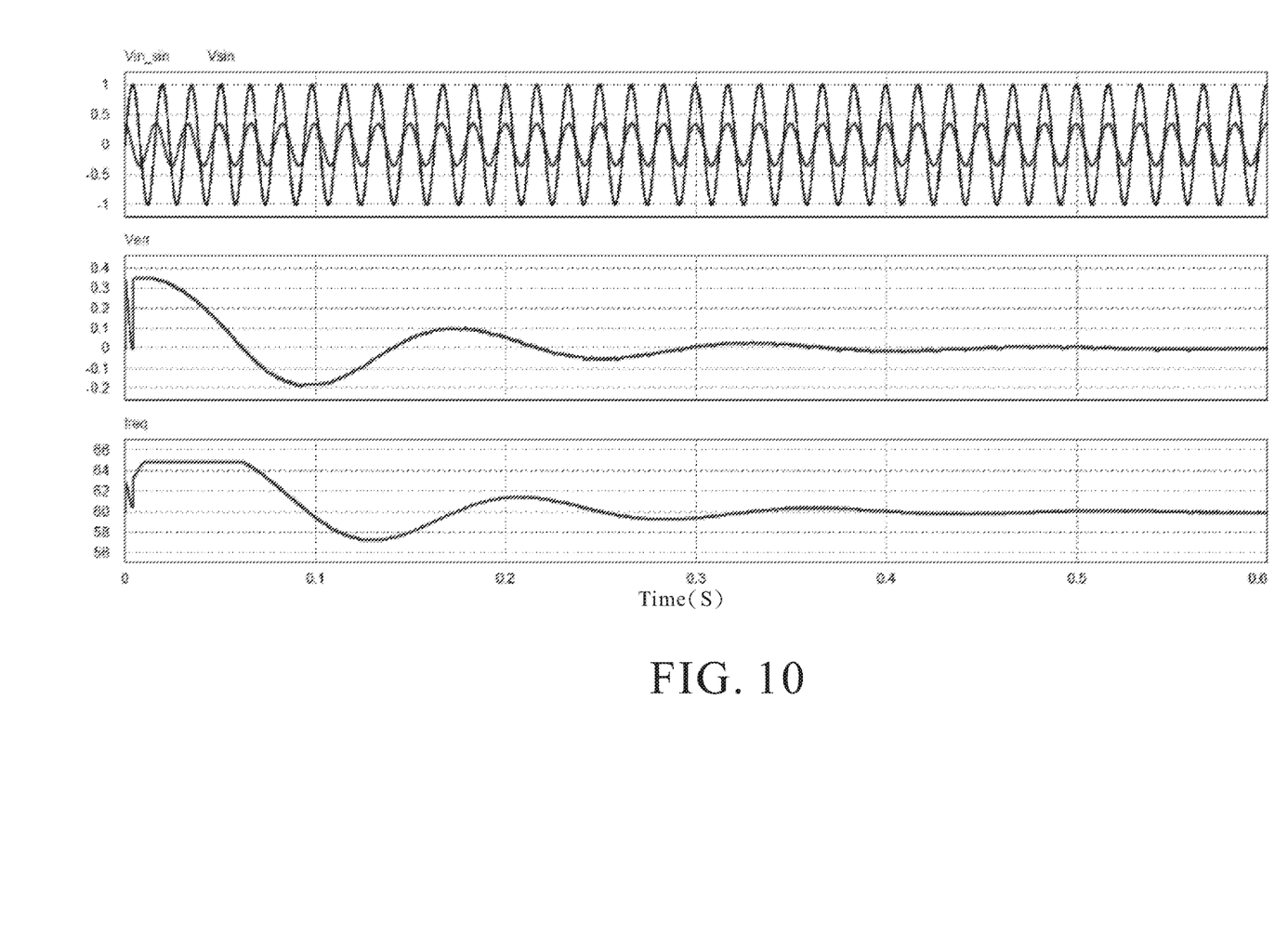
FIG. 10 is a schematic view of the results of simulation when the utility electricity has a single-phase voltage according to an embodiment of the present invention.

The phase-locked loop method of the present invention can undergo variation or adjustment to suit different types of utility electricity. FIG. 5~FIG. 7 are a schematic view, simulated circuit diagram, and simulation result diagram when the utility electricity has three-phase voltages according to an embodiment of the present invention, respectively. FIG. 8~FIG. 10 are a schematic view, simulated circuit diagram, and simulation result diagram when the utility electricity has a single-phase voltage according to an embodiment of the present invention, respectively.

Referring to FIG. 5, the three-phase voltages of utility electricity are $V_{sa}$, $V_{sb}$ and $V_{sc}$, respectively, which undergo abc–αβ axial conversion to obtain value $V_m \sin(\omega t)$ of the first conversion signal S1 and value $V_m \cos(\omega t)$ of the second conversion signal S2. The error value e is calculated as follows: multiplying the first conversion signal S1 and the second conversion signal S2 by the first synchronous signal S3 and the second synchronous signal S4, respectively, to obtain two products, and then using the difference between the two products as the error value e. The error value e is processed with a proportional integrator PI to obtain a frequency correction signal Δω.

Referring to FIG. 6 and FIG. 7, the phase difference between phase A of the input three-phase voltages and the sine table is set to 100 degrees during the process of setting the initial voltage levels. By performing correction with the phase-locked loop, error (Verr) decreases gradually until the input voltage (Vin_sin) and sine table (V sin) are in-phase, and the frequency (Freq) is locked to equal to that of the utility electricity voltage, i.e., 60 Hz.

Referring to FIG. 8, the utility electricity has a single-phase voltage and undergoes a sampling step 111 and a delaying step 112 to obtain value $V_m \sin(\omega t)$ of the first conversion signal S1 and value $V_m \cos(\omega t)$ the second conversion signal S2. The error value e is calculated as follows: multiplying the first conversion signal S1 and the second conversion signal S2 by the first synchronous signal S3 and the second synchronous signal S4, respectively, to obtain two products, and then using the difference between the two products as the error value e. The error value e is processed with a proportional integrator PI to obtain a frequency correction signal Δω.

Referring to FIG. 9 and FIG. 10, the phase difference between the phase of the input single-phase voltage and the sine table is set to 100 degrees during the process of setting the initial voltage level. By performing correction with the phase-locked loop, error (Verr) decreases gradually until the input voltage (Vin_sin) and sine table (V sin) are in-phase, and the frequency (Freq) is locked to equal to that of the utility electricity voltage, i.e., 60 Hz.

In conclusion, with the steps, the phase-locked loop method of the present invention achieves synchrony precisely by eliminating input utility electricity voltage distortion and frequency variation. Furthermore, the phase-locked loop method advantageously features quick response and a wide frequency range and therefore is effective in tracking power generation facilities, such as a diesel generator, and expanding inverters.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

The claims are as follows:

1. A phase-locked loop method for use in a utility electricity parallel-connection system, comprising:

a conversion signal generating step of generating a first conversion signal and a second conversion signal according to a detected voltage of a utility electricity, wherein the first conversion signal is generated based upon a first function, and the second conversion signal is generated based upon second function;

an error calculating step of calculating an error value according to values of the first conversion signal, the second conversion signal, a first synchronous signal, and a second synchronous signal, respectively, wherein the first synchronous signal is generated based upon the second function, and the second synchronous signal is generated based upon the first function;

a frequency correction signal obtaining step of entering an error signal with the error value into a proportional integrator to obtain a frequency correction signal;

an angle signal obtaining step of adding the frequency correction signal and the frequency of the voltage of the utility electricity to obtain an adjustment frequency and then calculating an integral of the adjustment frequency to obtain an angle signal; and a synchronous signal generating step of looking up a first function table and a second function table to obtain a value related to the angle value of the angle signal, wherein the value related to the angle value of the angle signal and attributed to the first function table is used as a value of the first synchronous signal, and the value related to the angle value of the angle signal and attributed to the second function table is used as a value of the second synchronous signal;

wherein the first function table is a sine table, and the second function table is a cosine table, with a 90 degree phase difference between the first synchronous signal and the second synchronous signal.

2. The phase-locked loop method of claim 1, wherein the error calculating step comprises:

a first product obtaining step of multiplying the value of the first conversion signal by the value of the first synchronous signal to obtain a first product;

a second product obtaining step of multiplying the value of the second conversion signal by the value of the second synchronous signal to obtain a second product; and an error value obtaining step of subtracting the second product from the first product to obtain the error value.

3. The phase-locked loop method of claim 1, wherein an angle limiting step occurs between the angle signal obtaining step and the synchronous signal generating step and involves limiting the angle value of the angle signal to a range by a range limiter.

4. The phase-locked loop method of claim 1, wherein the utility electricity has three-phase voltages which are detected in the conversion signal generating step to generate the first conversion signal and the second conversion signal.

5. The phase-locked loop method of claim 1, wherein the utility electricity has a single-phase voltage which is detected in the conversion signal generating step to generate the first conversion signal and the second conversion signal.

6. The phase-locked loop method of claim 5, wherein the conversion signal generating step further comprises a sampling step for sampling the detected single-phase voltage of the utility electricity to generate the first conversion signal.

7. The phase-locked loop method of claim 6, wherein the conversion signal generating step further comprises a delaying step for delaying the first conversion signal to generate the second conversion signal.

8. A phase-locked loop method for use in a utility electricity parallel-connection system, comprising:

a conversion signal generating step of generating a first conversion signal and a second conversion signal according to a detected voltage of a utility electricity, wherein the first conversion signal is generated based upon a first function, and the second conversion signal is generated based upon second function;

an error calculating step of calculating an error value according to values of the first conversion signal, the second conversion signal, a first synchronous signal, and a second synchronous signal, respectively, wherein the first synchronous signal is generated based upon the second function, and the second synchronous signal is generated based upon the first function;

a frequency correction signal obtaining step of entering an error signal with the error value into a proportional integrator to obtain a frequency correction signal;

an angle signal obtaining step of adding the frequency correction signal and the frequency of the voltage of the utility electricity to obtain an adjustment frequency and then calculating an integral of the adjustment frequency to obtain an angle signal; and a synchronous signal generating step of looking up a first function table and a second function table to obtain a value related to the angle value of the angle signal, wherein the value related to the angle value of the angle signal and attributed to the first function table is used as a value of the first synchronous signal, and the value related to the angle value of the angle signal and attributed to the second function table is used as a value of the second synchronous signal;

wherein an angle limiting step occurs between the angle signal obtaining step and the synchronous signal generating step and involves limiting the angle value of the angle signal to a range by a range limiter.

9. A phase-locked loop method for use in a utility electricity parallel-connection system, comprising:

a conversion signal generating step of generating a first conversion signal and a second conversion signal according to a detected voltage of a utility electricity, wherein the first conversion signal is generated based upon a first function, and the second conversion signal is generated based upon second function;

an error calculating step of calculating an error value according to values of the first conversion signal, the second conversion signal, a first synchronous signal, and a second synchronous signal, respectively, wherein the first synchronous signal is generated based upon the second function, and the second synchronous signal is generated based upon the first function;

a frequency correction signal obtaining step of entering an error signal with the error value into a proportional integrator to obtain a frequency correction signal;

an angle signal obtaining step of adding the frequency correction signal and the frequency of the voltage of the utility electricity to obtain an adjustment frequency and then calculating an integral of the adjustment frequency to obtain an angle signal; and a synchronous signal generating step of looking up a first function table and a second function table to obtain a value related to the angle value of the angle signal, wherein the value related to the angle value of the angle signal and attributed to the first function table is used as a value of the first synchronous signal, and the value related to the angle value of the angle signal and attributed to the second function table is used as a value of the second synchronous signal;

wherein the utility electricity has three-phase voltages which are detected in the conversion signal generating step to generate the first conversion signal and the second conversion signal.

* * * * *